(12) United States Patent
You et al.

(10) Patent No.: US 6,388,309 B1
(45) Date of Patent: May 14, 2002

(54) APPARATUS AND METHOD FOR MANUFACTURING SEMICONDUCTORS USING LOW DIELECTRIC CONSTANT MATERIALS

(75) Inventors: Lu You, Santa Clara; Dawn M. Hopper, San Jose; Richard J. Huang, Cupertino, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/687,180

(22) Filed: Oct. 12, 2000

Related U.S. Application Data

(62) Division of application No. 09/135,077, filed on Aug. 17, 1998, now Pat. No. 6,197,703.

(51) Int. Cl.[7] .......................... H01L 23/58; C23C 16/00; C23C 16/14
(52) U.S. Cl. .................. 257/632; 257/634; 118/723 E; 427/255.391; 427/535
(58) Field of Search .................... 257/632, 634; 118/723 E; 427/255.391, 535

(56) References Cited

U.S. PATENT DOCUMENTS

| | | | | |
|---|---|---|---|---|
| 4,987,856 A | * | 1/1991 | Hey et al. | 118/723 E |
| 5,044,311 A | * | 9/1991 | Mase et al. | 118/723 E |
| 5,548,159 A | * | 8/1996 | Jeng | 257/634 |
| 5,648,175 A | * | 7/1997 | Russell et al. | 428/472.3 |
| 5,763,018 A | * | 6/1998 | Sato | 427/535 |
| 5,812,403 A | * | 9/1998 | Fong et al. | 700/121 |
| 5,834,068 A | * | 11/1998 | Chern et al. | 427/535 |

* cited by examiner

Primary Examiner—Matthew Smith
Assistant Examiner—Lex H. Malsawma
(74) Attorney, Agent, or Firm—Mikio Ishimaru

(57) ABSTRACT

An ultra-large scale integrated circuit is manufactured by using silicon-based, low dielectric constant materials which are spin-coated, dried, cured, and capped in-situ in chemical vapor deposition equipment. The low dielectric constant material is spun on, processed in chemical vapor deposition equipment, subject to chemical-mechanical polishing, and then processed by a conventional photolithographic process for depositing conductors. The material is then reprocessed for each successive layer of conductor separated by dielectric.

15 Claims, 2 Drawing Sheets

APPARATUS AND METHOD FOR MANUFACTURING SEMICONDUCTORS USING LOW DIELECTRIC CONSTANT MATERIALS

CROSS REFERENCE TO RELATED APPLICATION(S)

This is a divisional of application Ser. No. 09/135,077 filed on Aug. 17, 1998 now U.S. Pat. No. 6,197,703.

The present application contains subject matter related to a co-pending U.S. Patent Application by Dawn M. Hopper, Richard J. Huang, and Lu You entitled "METHOD FOR IMPROVING SEMICONDUCTOR DIELECTRICS". The related application was filed on Aug. 12, 1998, is assigned to Advanced Micro Devices, Inc., and is identified by Ser. No. 09/133,042.

TECHNICAL FIELD

The present invention relates generally to semiconductor manufacturing and more specifically to integrated circuit manufacturing using silicon-based, low dielectric constant materials and chemical vapor deposition equipment.

BACKGROUND ART

Silicon compounds, such as silicon dioxide, that can be used as coatings are particularly valuable on electronic substrates. Such coatings serve as protective coatings, inter-level dielectric layers, doped dielectric layers to produce transistor-like devices, multilayer devices, etc.

Unfortunately, development of high integration and high-density very large scale integrated circuits has progressed so rapidly that earlier silicon compounds have become less than satisfactory. The reductions in size have been accompanied by increases in switching speed of such integrated circuits, and this has increased the problems due to capacitance coupling effects between closely positioned, parallel conductive channels connecting high switching speed semiconductor devices in these integrated circuits. This has necessitated a change from using silicon dioxide, which has a dielectric constant in excess of 4.0, to the use of lower dielectric constant materials.

The combination of high density and submicron geometries has also lead to the surfaces of semiconductor substrates having relatively large protrusions and depressions with small spaces in between. This has posed serious problems for fabrication technology because of the difficulty of providing uniform depositions and subsequently planarizing such surfaces. One answer has been to use dielectrics which are deposited on the silicon wafer in liquid form. By spinning on dielectric films in a liquid form followed by a series of soft bakes and a hard bake to cause solvent evaporation and curing, a high degree of uniformity and planarization have been achievable.

The soft bakes are performed on three different heating elements with a robot arm moving the silicon substrates from one heating element to another. The dielectric film-coated silicon substrates are heated at various temperatures for short periods of time. For example, for HSQ (hydrogen silsesquioxane) 60 seconds at 150° C. causes solvent evaporation. Then at 200° C. it causes reflow into the wafer's channels, and then at 350° C. it causes slight cross-linking. This prevents curing of the dielectric film before the solvent evaporates. The hard bake cure in an oven in a nitrogen gas ambient at 400° C. for an hour cures the HSQ.

The materials that have been used for the spun on dielectric films have included various organic silicon compounds in liquid solvents. These organic silicon compounds have included BCB (benzocyclobuten), TBOS (tetraethoxysilane), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), and SOP (trimethylsilil phosphate). And the fluid carrier would be a solvent such as MIBK (methyl isobutyl ketone) or mesitylene (1,3,5 trimethol benzene). One of the more commonly used silicon-based, low dielectric constant materials is HSQ (hydrogen silsesquioxane) in MIBK solvent.

Unfortunately, these organic materials tend to be difficult to planarize and often react chemically to the photoresists used in the photolithographic processes required to create the interconnects for the transistors and other elements of an integrated circuit. This means that the dielectric films must be covered, or capped, by another material after baking and curing. Cap layers are also used as etch hard masks or chemical-mechanical polishing (CMP) stop layers in the damascene process.

It has been found that a good capping material is silicon dioxide, $SiO_2$, silicon nitride, SiN, or SiON, silicon oxynitride. However, this requires the dielectric film-coated silicon wafer to be transferred from the oven to deposition apparatus, such as chemical vapor deposition (CVD) equipment, for deposition of the capping material. After capping, the wafer must be transferred for planarization by CMP before being transferred to the photolithographic processing equipment and other equipment for the deposition of a level of interconnects.

The above steps must then be repeated for additional levels of dielectrics and interconnects. Currently, five levels are common, but many more levels are projected in the future.

As well known in the art, there are numerous problems with the above system. Not only are there long delays between steps, but the system is subject to particle and surface contamination on the dielectric films during each of the transfers. In addition, the multiple transfers afford opportunity for possible breakage, many tools are required, and the cycle process time is long. All of these mean that the process is quite expensive.

DISCLOSURE OF THE INVENTION

The present invention provides an apparatus and method in which drying and curing of a low dielectric constant film on a silicon wafer, and subsequent capping of the film, is done in-situ in chemical vapor deposition equipment.

The present invention further provides an apparatus and method for shortening the process time for manufacturing semiconductors requiring inter-level dielectric and interconnect layers.

The present invention further provides an apparatus and method for eliminating the queue time between processing steps.

The present invention provides an apparatus and method for eliminating transfers between baking and capping.

The present invention still further provides an apparatus and method for reducing particles and contamination on the low dielectric constant material before capping.

The present invention still further provides an apparatus and method which results in better adhesion between the low dielectric constant film and the capping layer.

The present invention still further provides an apparatus and method for making the above improvements extend from spinning on the low dielectric constant film to completion of the chemical vapor deposition of the capping material.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
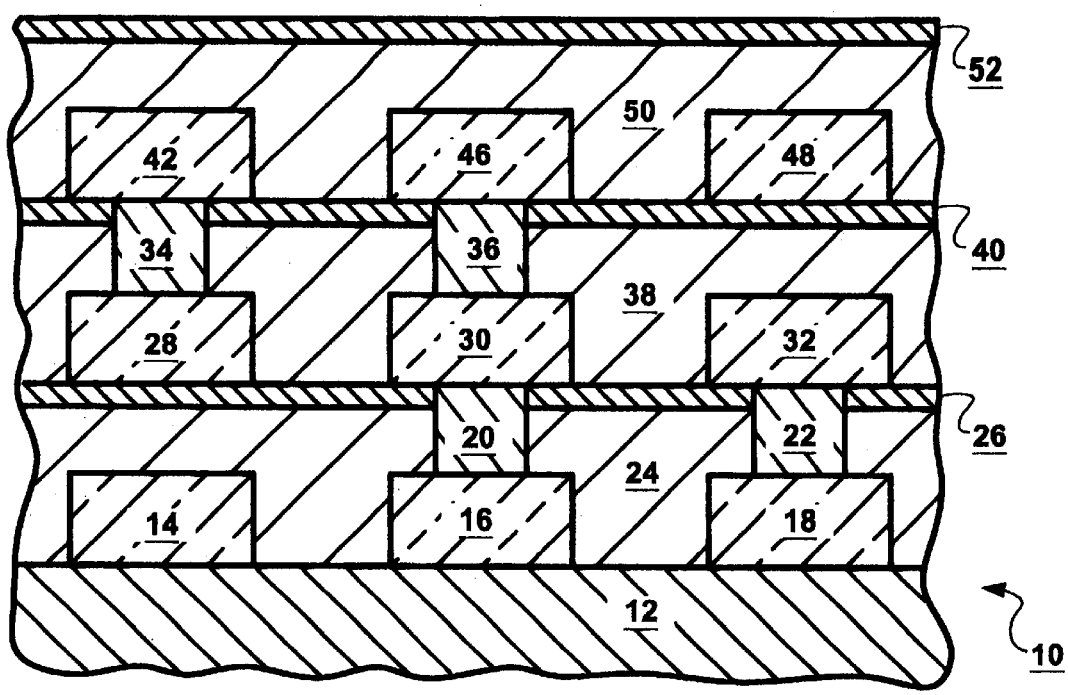
FIG. 1 is a cross-section of a portion of a multilayer semiconductor device.

Referring now to FIG. 1, therein is shown a portion of a semiconductor wafer 10 including a silicon substrate 12 having various semiconductor devices therein, such as transistors, resistors, and capacitors (not shown). The silicon substrate 12 has a series of parallel running conductive interconnects 14, 16, and 18 disposed thereon by a photolithographic and metallization process, such as subtractive or damascene processes.

Connected to the interconnect 16 and 18 are shown conductive vias 20 and 22, respectively. Around the interconnects 14, 16, and 18 and the vias 20 and 22 is an interlayer dielectric 24 having a protective cap 26 of silicon dioxide, silicon nitride, or silicon oxynitride deposited thereon by chemical vapor deposition. The interlayer dielectric 24 is preferably hydrogen silsesquioxane (HSQ) or benzocyclobutene (BCB).

On top of the cap 26 is another series of parallel interconnects 28, 30, and 32. It should be understood that these are shown parallel to the interconnects 14, 16, and 18 but may actually be perpendicular thereto. The interconnects 28 and 30 have respective vias 34 and 36 in conductive contact therewith.

The interconnects 28, 30, and 32 and the vias 34 and 36 are surrounded by an interlayer dielectric film 38 having a protective cap 40 deposited thereon.

While the semiconductor wafer 10 can have numerous levels of interlayer dielectric and capping, three to five levels tend to be typical. In FIG. 1, a third level is shown having conductive metal, such as aluminum or copper, interconnects 42, 46, and 48 disposed on the protective cap 40. The interconnects 42, 46, and 48 are surrounded by the interlayer dielectric film 50 and capped by a protective cap 52.

Figure 2:
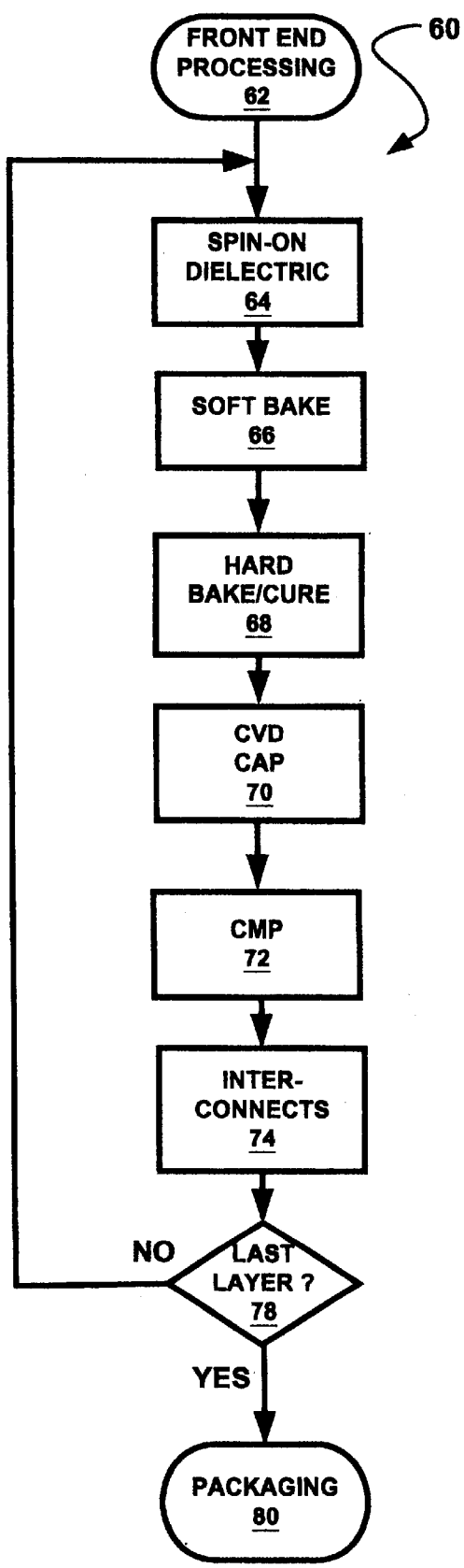
FIG. 2 (PRIOR ART) is a flow chart of the prior art process used for manufacturing multilayer semiconductor devices.

Referring now to FIG. 2 (PRIOR ART), therein is shown the prior art process flow 60. The process flow 60 starts with the conventional front end processing 62 for the semiconductor wafer 10. The wafer 10 is then transferred to conventional dielectric material application equipment (not shown) for deposition of a spin-on dielectric in block 64. In block 64 an organic dielectric material in a solvent is spun onto the wafer 10 using conventional spin deposition equipment.

After spin deposition in block 64, the wafer 10 is soft baked, as indicted by block 66. In soft bake, the wafers 10 are placed on plates which are heated to successively higher temperatures to remove solvent from the silane interlayer dielectric 24, shown in FIG. 1.

After the soft bake of block 66, the wafer 10 is subject to a hard bake, or cure, at block 68. This hard bake, or cure, of block 68 is performed in a vacuum oven or furnace, usually at 400° C. for HSQ for between forty-five minutes and about one hour and fifteen minutes, to evaporate any remaining water in the interlayer dielectric 26 and to cause crosslinking of the organic polymers.

After hard bake in block 68, the wafer 10 is transferred to chemical vapor deposition (CVD) equipment 110 (shown in FIG. 4) for the deposition of the capping material in block 70. The capping material is generally silicon dioxide, silicon nitride, or silicon oxynitride. In the chemical vapor deposition equipment, the wafer 10 is heated by lamps applying infrared radiation to the wafer support, or susceptor, or by electric resistive heating of the wafer 10 directly. A vacuum is then drawn and the appropriate precursor gas flow started across the surface of the wafer 10. Generally, silane or TEOS is used to obtain silicon dioxide, and silane and ammonia are used to obtain silicon nitride.

For the subtractive metallization process, after chemical vapor deposition in block 70, the wafer 10 is transferred to chemical-mechanical polishing (CMP) equipment in block 72 for planarization of the cap material. After the CMP of block 72, the wafer 10 is transferred over for photolithography and interconnect processing in block 74. After a CMP process for further planarization, the process moves to the decision block 78 to determine whether the last layer of interlayer dielectric has been deposited. If so, the wafer 10 is sent on for continued packaging processing as shown by block 80. If additional layers are required, the wafer 10 is sent back to the dielectric material application equipment to have additional layers applied starting at the spin deposition block 64. In the case with the damascene metallization process, the wafer 10 is sometimes sent for photolithography directly after capping without CMP of the cap layer.

Figure 3:
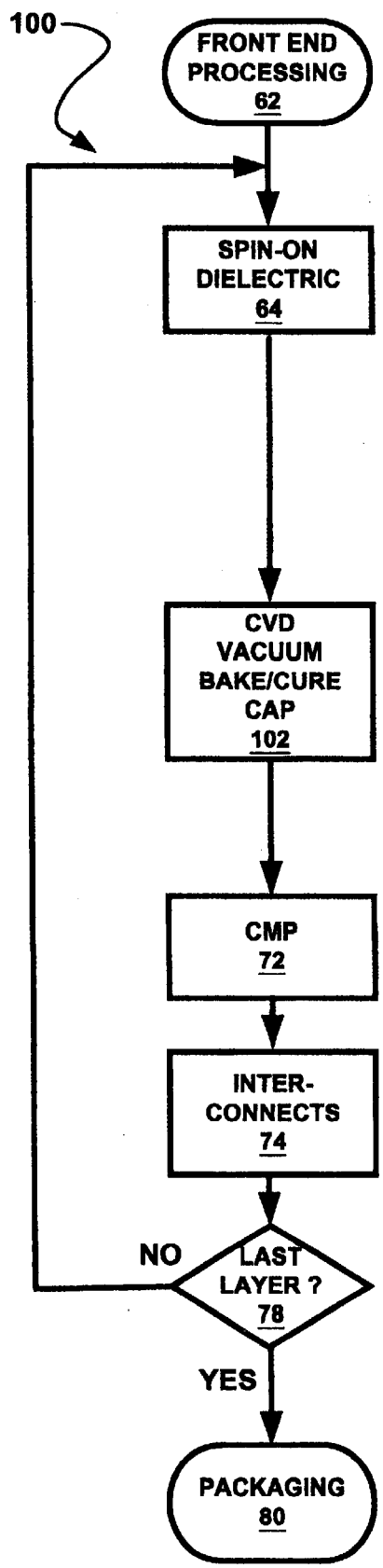
FIG. 3 is a flow chart of the process of the present invention.

Referring now to FIG. 3, therein is shown the process flow 100 of the present invention. The same numbers are used in the process flow 100 for those steps which are the same as for the prior art process flow 60.

From the front end processing 62, the wafer 10 goes to the dielectric material application equipment for spin deposition of the dielectric in block 64. From the block 64, the wafer 10 is transferred directly to the chemical vapor deposition equipment 110 (shown in FIG. 4) for this processing step 102 of vacuum bake/cure and cap.

Since the chemical vapor deposition equipment 110 is provided with heating equipment and vacuum equipment, the soft bake and the hard bake/cure can be accomplished as preparatory steps for the chemical vapor deposition. Since the wafer 10 no longer has to be transferred into the soft bake equipment, out of the soft bake equipment into the vacuum baking equipment, and out of the vacuum baking equipment into the chemical vapor deposition equipment, two transfer steps are eliminated. This eliminates the possibility of particulate or chemical contamination during those steps, as well as breakage and the time delay imposed by those transfers.

Further, by utilizing the attributes inherent in the chemical vapor deposition equipment, it is possible to avoid the need for the soft bake heating equipment and track, as well as the vacuum furnace, both of which are very expensive pieces of equipment.

Figure 4:
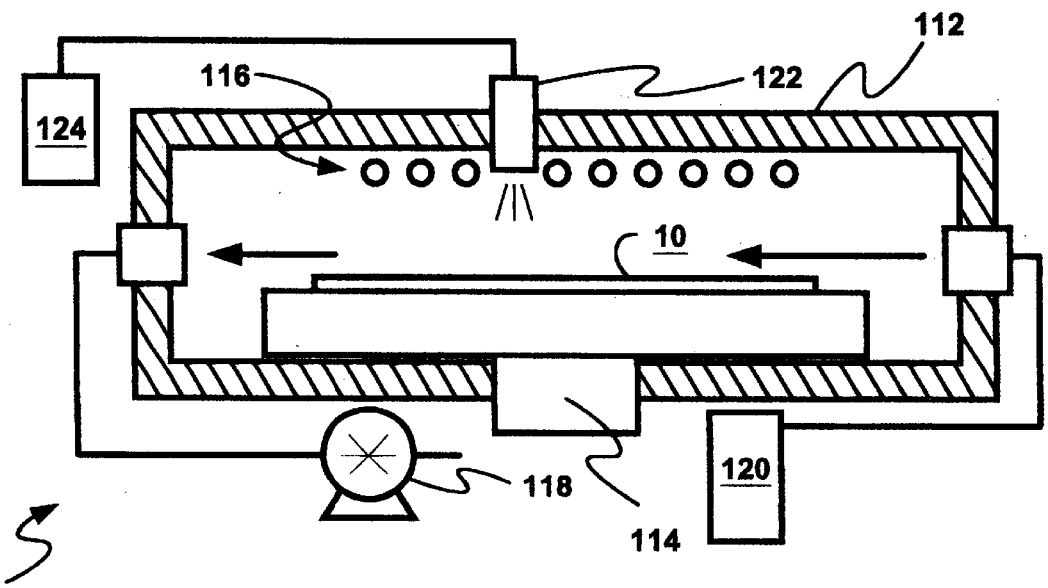
FIG. 4 is the cross-section of the chemical vapor deposition equipment used in the present invention for manufacturing semiconductors using low dielectric constant materials.

Referring now to FIG. 4, therein is shown the chemical vapor deposition equipment 110 consisting of a chamber 112 containing a carrier 114 holding the semiconductor wafer 10. The wafer 10 is heated by heat lamps 116 or electric resistive hot plates. Air is evacuated from one end of the chamber 112 by a vacuum pump 118, and various precursor gases are released into the chamber 112 from a gas source 120.

Also shown in FIG. 4 is a dielectric material application system consisting of a dispenser 122 and a dielectric material supply 124. By providing a mechanism for spinning the carrier 114, the transfer step from the spinning equipment to the chemical vapor deposition equipment 110 could also be eliminated.

In the prior art system, a wafer 10, having been front-end processed, would have the dielectric material applied by spinning, followed by successive soft bakes on heat plates heated to 150° C., 250° C., and 350° C. as in the case with HSQ. At each hot plate, the wafer 10 would be heated for about 60 seconds each to evaporate off the solvent. The wafer 10 would then be placed into a vacuum or inert gas oven or furnace for a hard bake/cure at 400° C. for between 45 minutes and one hour and fifteen minutes to remove residual, or cure, water and cure the organics. The bulk of this time is used to bring the wafer 10 up to temperature and to stabilize it at that temperature.

The wafer 10 would be cooled and then placed in chemical vapor deposition equipment 110. In the chemical vapor deposition equipment 110, the wafer 10 would be heated and the pump 118 would evacuate the chamber 112. When the chamber 112 was sufficiently evacuated, the deposition precursor gas would be allowed in from the source 120 into the chamber 112 such that the heating of the wafers 110 by the heating elements 116 would cause deposition of the desired chemicals from the vapor. This direction is shown by the arrows. This would provide the silicon oxide, silicon nitride, or silicon oxynitride cap.

After chemical vapor deposition, the wafer 10 would be sent to chemical-mechanical polishing for planarizing the cap layer 26, 40, or 52, in the case of the subtractive metallization process, or for photolithography in the case of the damascene process.

The cycle would then be repeated as necessary to build up the required number of layers.

In the present invention, in operation, the wafer 10 is front-end processed and then has the interlayer dielectric film 24 applied by spinning. The wafer 10 is transferred from the spinning equipment, which deposits the low dielectric constant material, to the chemical vapor deposition equipment 110. A vacuum of at least 10-3 torr is applied in the chamber 112.

While a soft bake is possible, it is preferred that the chemical vapor deposition equipment 110 heat the wafer 10 on a gradual temperature ramp of less than 10° C. per minute to accomplish the same result as the evaporating out of the solvent and residual water. For HSQ the temperature would then be brought up to 400° C. for the time necessary for the last of the water to evaporate out and the silane not to become silicon oxide. For BCB, the cure temperature is around 325° C. The cure can be completed with some dielectrics, such as BCB, in less time (in minutes) than with prior art systems.

Once the proper dielectric constant of the material is reached, about 2.8 for HSQ of 2.6 for BCB, the chemical vapor deposition equipment 110 can be brought into the proper temperature and the necessary gases released from the source 120 deposit to the protective cap 26 at the low dielectric constant material cure temperature. By having the protective cap 26 deposited immediately after cure, adhesion of the protective cap 26 to the interlayer dielectric film is greatly enhanced in addition to achieving a minimization of contamination.

After the chemical vapor deposition, the wafer 10 is subject to CMP for planarization and/or then to photolithographic processing and deposition of the interconnects 28, 30, and 32.

From this point, the wafer 10 would be returned to the dielectric material application equipment for spin deposition of the interlayer dielectric film 38 and repetition of the process until the desired layers are obtained.

As would be evident, when the dispenser 122 and the dielectric material supply 124 are provided along with the capability of spinning the carrier 114, the step of transferring the wafer 10 from the dielectric material application equipment to the chemical vapor deposition equipment 110 could also be eliminated. The low dielectric constant material and its cap layer can be deposited in-situ in a single system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An apparatus for manufacturing a semiconductor wafer comprising:

chemical vapor deposition equipment for containing the semiconductor wafer;

a dielectric material application system for depositing a low dielectric constant material onto the semiconductor wafer within the chemical vapor deposition equipment by non-chemical vapor deposition;

a vacuum pump system for removing oxygen from the semiconductor wafer in said chemical vapor deposition equipment;

heating means for heating the semiconductor wafer in said chemical vapor deposition equipment at a temperature below the temperature at which said low dielectric material is oxidized into silicon dioxide and at a temperature at which chemical vapor deposition occurs; and means for depositing a cap material selected from the group containing silicon dioxide, silicon oxynitride, and silicon nitride on said low dielectric constant material by chemical vapor deposition whereby said removing heating, depositing said low dielectric constant material, and depositing said cap material steps are performed sequentially without removing the semiconductor wafer from said chemical vapor deposition equipment.

2. The apparatus as claimed in claim 1 wherein said vacuum pump system includes means for evacuating said chemical vapor deposition equipment to at least $10^{-3}$ torr.

3. The apparatus as claimed in claim 1 wherein said vacuum pump system includes means for flowing an inert gas through said chemical vapor deposition equipment.

4. The apparatus as claimed in claim 1 wherein:

said heating means includes means for heating the semiconductor wafer until the dielectric constant of said low-dielectric constant material is below 2.8.

5. The apparatus as claimed in claim 1 wherein: said heating means includes means for providing a gradual ramp of temperature of not more than 10° C. per minute to the semiconductor wafer.

6. An apparatus for manufacturing a semiconductor wafer comprising:

chemical vapor deposition equipment for containing the semiconductor wafer;

a dielectric material application system for depositing a low dielectric constant material onto the semiconductor wafer within the chemical vapor deposition equipment by spin-deposition;

a vacuum pump system for removing oxygen from the semiconductor wafer in said chemical vapor deposition equipment;

heating means for heating the semiconductor wafer in said chemical vapor deposition equipment at a temperature below the temperature at which said low dielectric constant material is oxidized into silicon dioxide and at a temperature at which chemical vapor deposition occurs; and means for depositing a cap material selected from the group containing silicon dioxide, silicon oxynitride, and silicon nitride on said low dielectric constant material by chemical vapor deposition whereby said removing heating depositing said low dielectric constant material, and depositing said cap material steps are performed sequentially without removing the semiconductor wafer from said chemical vapor deposition equipment.

7. The apparatus as claimed in claim 6 wherein said vacuum pump system includes means for evacuating said chemical vapor deposition equipment to at least $10^{-3}$ torr.

8. The apparatus as claimed in claim 6 wherein said vacuum pump system includes first means for flowing an inert gas selected from the group containing argon and xenon through said chemical vapor deposition equipment and second means for flowing a precursor gas for chemical vapor deposition through said chemical vapor deposition equipment.

9. The apparatus as claimed in claim 6 wherein:

said heating means includes means for heating the semiconductor wafer at 400° C. until the dielectric constant of said low-dielectric-constant material is below 2.8.

10. The apparatus as claimed in claim 6 wherein:

said heating means includes means for providing a gradual ramp of temperature of not more than 10° C. per minute up to 400° C. to the semiconductor wafer.

11. An apparatus for manufacturing a semiconductor wafer comprising:

chemical vapor deposition equipment for containing the semiconductor wafer;

a dielectric material application system for depositing a low dielectric constant material in a solvent onto the semiconductor wafer within the chemical vapor deposition equipment, the dielectric material application system including:

a dispenser, and a mechanism for spinning the semiconductor wafer;

a vacuum pump system for removing solvent and oxygen from the semiconductor wafer in said chemical vapor deposition equipment;

heating lamps for heating the semiconductor wafer in said chemical vapor deposition equipment for curing the low dielectric constant material at a temperature below the temperature at which said low dielectric constant material is oxidized into silicon dioxide and at a temperature at which chemical vapor deposition occurs; and means for depositing a cap material selected from the group containing silicon dioxide, silicon oxynitride, and silicon nitride on said low dielectric constant material by a chemical vapor deposition process whereby said removing, heating, depositing said low dielectric constant material, and depositing said cap material steps are performed sequentially without removing the semiconductor wafer from said chemical vapor deposition equipment.

12. The apparatus as claimed in claim 11 wherein said vacuum pump system includes means for evacuating said chemical vapor deposition equipment to at least $10^{-3}$ torr and maintaining the vacuum during solvent removal.

13. The apparatus as claimed in claim 11 wherein said vacuum pump system includes first means or flowing an inert gas selected from the group containing argon and xenon though said chemical vapor deposition equipment and second means for flowing a precursor gas for chemical vapor deposition through said chemical vapor deposition equipment.

14. The apparatus as claimed in claim 11 wherein:

said heating means includes means for heating the semiconductor wafer at 400° C. for forty-five minutes to one hour and fifteen minutes until the dielectric constant of said low-electric-constant material is below 2.8.

15. The apparatus as claimed in claim 11 wherein:

said heating means includes means for providing a gradual ramp of temperature of not more than 10° C. per minute up to 400° C. to the semiconductor wafer.

* * * * *